United States Patent [19]

Berndt et al.

[11] Patent Number: 5,047,661
[45] Date of Patent: Sep. 10, 1991

[54] SUPERLATTICE PRECISION VOLTAGE REFERENCE

[75] Inventors: Dale P. Berndt, Plymouth; Andrzej Peczalski, Brooklyn Park, both of Minn.

[73] Assignee: Honeywell Inc., Minneapolis, Minn.

[21] Appl. No.: 433,067

[22] Filed: Jan. 16, 1990

Related U.S. Application Data

[62] Division of Ser. No. 251,596, Sep. 30, 1988, Pat. No. 4,905,056.

[51] Int. Cl.⁵ .................. H03K 3/01; H01L 27/12
[52] U.S. Cl. ........................ 307/296.6; 307/308; 357/4
[58] Field of Search ............... 307/296.1, 296.6, 308, 307/322, 324; 357/4; 323/313

[56] References Cited

U.S. PATENT DOCUMENTS

| 2,709,780 | 5/1955 | Kircher | 307/324 |
| 4,785,230 | 11/1988 | Ovens et al. | 307/317.2 |
| 4,905,056 | 2/1990 | Berndt et al. | 354/4 |
| 4,948,989 | 8/1990 | Spratt | 307/296.6 |

Primary Examiner—Stanley D. Miller
Assistant Examiner—Richard Roseen
Attorney, Agent, or Firm—John G. Shudy, Jr.

[57] ABSTRACT

A precision voltage reference incorporating at least one superlattice resonant tunneling diode and support electronics. The precision voltage reference is stable as to temperature and radiation.

4 Claims, 7 Drawing Sheets

SUPERLATTICE PRECISION VOLTAGE REFERENCE

This application is a division, of application Ser. No. 07/251,596, filed Sept. 30, 1988 now U.S. Pat. No. 4,905,056.

FIELD OF THE INVENTION

The present invention pertains to precision voltage references and particularly to references employing majority carrier devices and more particularly to references based on a superlattice resonant tunneling diode.

RELATED ART

Many military and space systems need voltage references that are radiation hard in strategic space environments. For example, missile navigation systems and satellite focal plane systems contain analog-to-digital converters that require precision voltage references which are radiation hardened. Such precision voltage references need to be temperature stable over the full military temperature range and have a very low temperature coefficient. Of particular concern is the rather radiation soft nature of existing voltage references.

Many of the existing voltage references employ minority carrier devices which ar susceptible to neutron damage For instance, the well-known Widlar band gap reference circuit is a good voltage reference over the military specified temperature range, but it lacks stability due to neutron damage which reduces the beta of the bipolar devices used in its design. Other voltage references based on avalanche diodes, tunneling diodes, and hardened diodes typically do not meet the military requirements for either radiation stability or temperature stability.

SUMMARY OF THE INVENTION

The present invention fulfills the need that requires a radiation-hardened precision voltage reference having good temperature stability. The invention incorporates a superlattice resonant tunneling diode structure as the basis for the reference voltage. The superlattice differs from the bulk semiconductor lattice in that it has discrete energy levels instead of the usual continuous energy distribution in the valence and conduction bands. The quantization of energy levels is related to the superlattice period and semiconductor type, and thus is not affected by radiation. The resonant tunneling which occurs at a unique voltage determined by the discrete energy levels in superlattices provides a voltage reference that is stable as to temperature and radiation since the resonant voltage is dependent only on the quantum well thickness, Fermi-energy, and barrier heights of the materials used in the superlattice structure which determine the position of discrete energy levels. The support electronics for the voltage reference generator provide an output voltage proportional to the superlattice resonant voltage, with low output impedances and reduced sensitivities to input voltage and temperature. The resulting voltage reference has the capability to be stable for many years with respect to temperature and radiation.

BRIEF DESCRIPTION OF THE DRAWINGS

FIG. 5b is a schematic showing an implementation of the support electronics of FIG. 5a.

FIG. 6b is a schematic showing an implementation of the support electronics of FIG. 6a.

DESCRIPTION OF THE PREFERRED EMBODIMENT

Radiation-hardened precision voltage reference generator 20 or 30 (FIGS. 5 and 6) consists of radiation-hardened superlattice resonant tunneling diode 10 and associated support electronics. Resonant tunneling diode 10 of FIG. 1 is the key component to the voltage reference 20 and 30 and provides the radiation hardness, while the support electronics use the characteristics of superlattice diode 10 to provide an output voltage that is constant with respect to input supply voltage, output load current, temperature and radiation.

Resonant tunneling in superlattice multibarrier Gallium Arsenide (GaAs)—aluminum (Al) GaAs structures has occurred in such structures grown by molecular beam epitaxy (MBE) and by metal organic chemical vapor deposition (MOCVD). A peak in the current density (J)—voltage (V) curves (FIGS. 3 and 4) of these structures is observed when injected carriers have energies characteristic of the quantum wells. The superlattice structure is designed having a well-defined peak current at a specified voltage for application in a precision-voltage reference.

Figure 1:
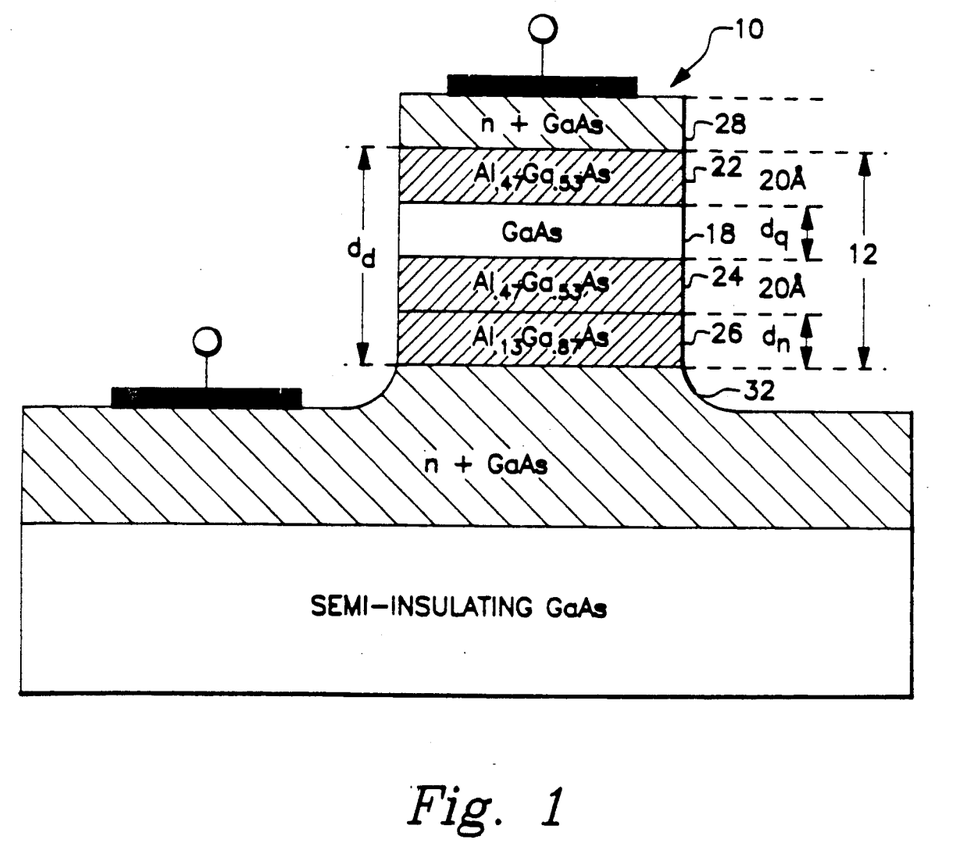
FIG. 1 shows a superlattice resonant tunneling diode structure.

FIG. 1 shows a minimum configuration superlattice resonant tunneling diode 10. The superlattice structure 12 consists of a double barrier system of GaAs and AlGaAs layers. The composition of the $Al_xGa_{1-x}$ layer can be varied to give the desired barrier height, while the thickness $d_q$ of undoped GaAs 18 defines the quantum well. Device 10 is radiation hard since the voltage at which the resonant peak current occurs depends primarily on the physical constants of quantum well thickness $d_q$, conduction band discontinuity and Fermi-energy.

Figure 2:
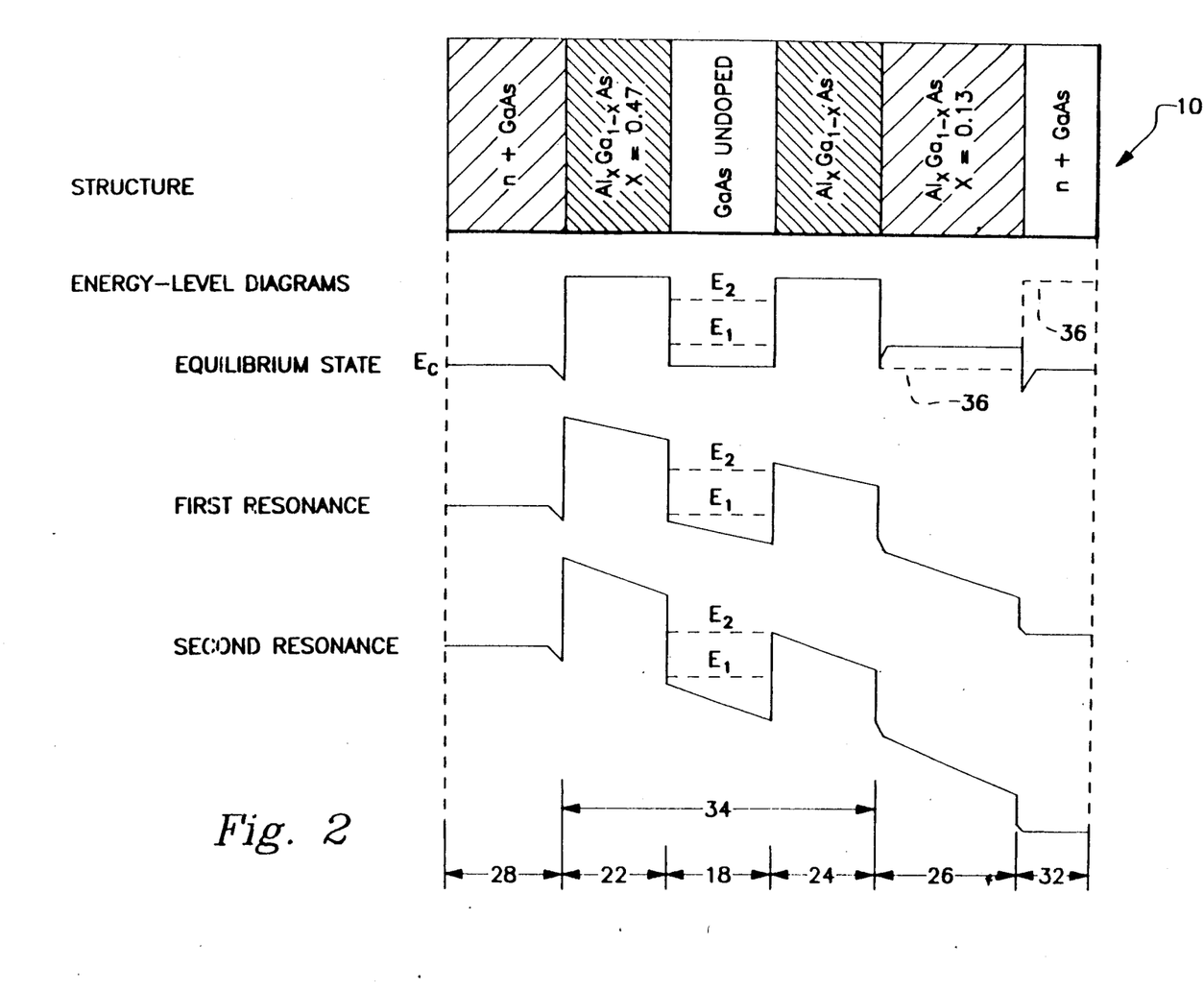
FIG. 2 shows the structure and energy diagrams of a superlattice resonant tunneling diode.

Quantum well heterostructure devices are based on the effects of discontinuous band edges in multilayer semiconductors. The structure and energy-level diagrams of FIG. 2 illustrate the basics for resonant tunneling. A typical quantum-well 18 structure consists of a very thin layer of smaller band-gap material sandwiched between two layers 22 and 24 of a larger band-gap material. The superlattice structure 34 is placed between two thick layers 28 and 32 of the smaller band-gap n+ doped GaAs material to form ohmic contacts, which result in a heterostructure double barrier diode 10. If width $d_g$ of the potential well is small enough, i.e., 10 Å to 100 Å, quantum effects cause the formation of discrete allowed energy levels $E_1$ and $E_2$ within well 18 above the normal conduction band edge (i.e., energy level Ec) of n+GaAs 28. In the equilibrium state, with no voltage applied across diode 10, there are no injected electrons and therefore no collected current. As the voltage across diode 10 increases, conduction band of 28 at the cathode side (left side of FIG. 2) comes closer to first energy level $E_1$, and the current increases. The current flow through diode 10 attains the maximum when cathode conduction band of 28 is aligned with quantum well structure 34 energy level $E_1$. With further bias voltage increase across diode 10, the current flow through diode 10 decreases and then rises again to reach another maximum when energy level $E_2$ is aligned with conduction band of 28. The decrease of current with increase of bias voltage is regarded as the negative differential resistance phenomenon as indicated to the right of the peak of any curve of the current density versus voltage graph such as in FIGS. 3 and 4. Since only the first maximum of the current density versus voltage curve is easily obtainable, the reference voltage generator 20 or 30 is based on the first quantum energy level $E_1$ in the superlattice of FIG. 2.

Figure 3:
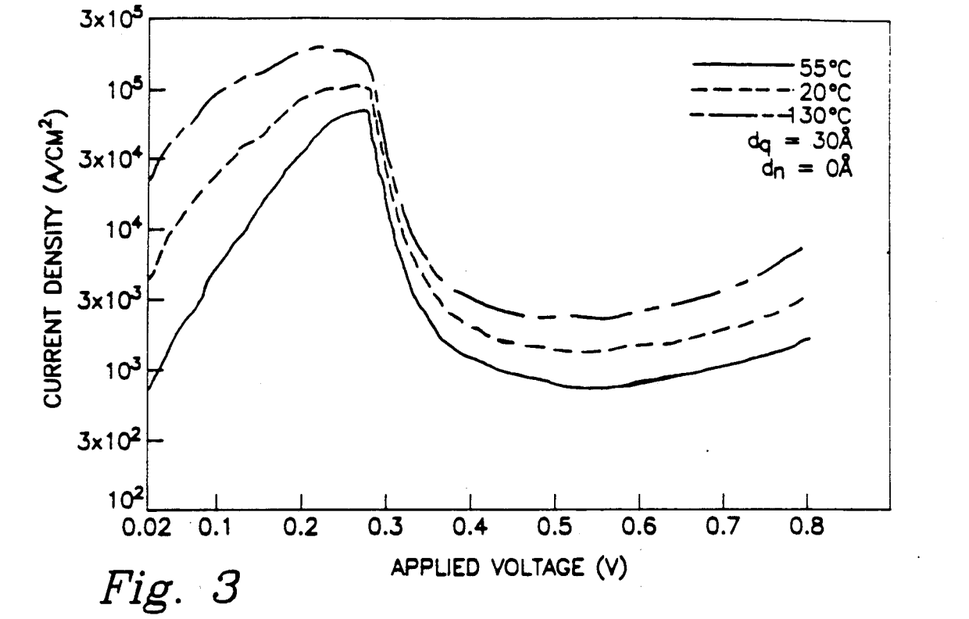
FIG. 3 is a graph of the J-V characteristics of a resonant tunneling diode having a quantum well width of 30 Å, a neutral region width of 0 Å and a device width of 70 Å.
Figure 4:
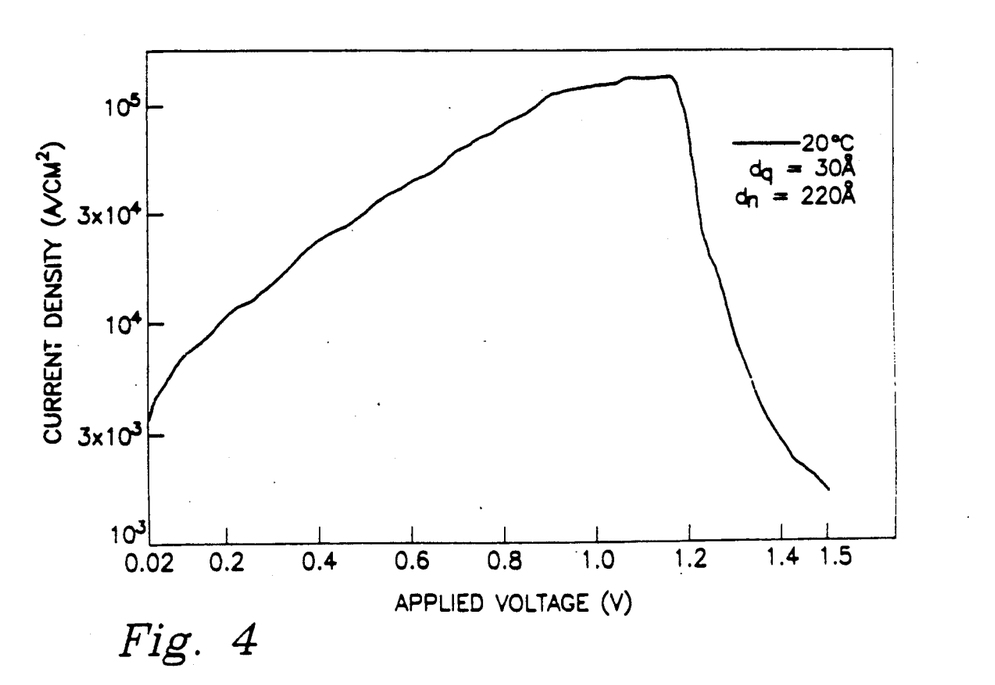
FIG. 4 is a graph of the J-V characteristics of a resonant tunneling diode having a quantum well width of 30 Å, a neutral region width of 220 Å and a device width of 290 Å.

A quantum well 18 energy level calculation or the energy band discontinuity of 0.5 volts (V) (corresponding to the Al content x=0.47 in layers 22 and 24) indicates that the zero bias energy level, $E_1$, is equal to 78 millivolts (mV), 175 mV, and 253 mV for quantum well width $d_q$ of 50 Å, 30 Å and 20 Å, respectively. The calculation is not completely accurate because it does not account for bias voltage and Fermi-Dirac distribution. Numerical calculations of resonant diode 10 with neutral region 26 thickness $d_n$ of 220 Å and quantum well 18 thicknesses $d_q$ of 50 Å and 30 Å show the peak current occurring at 375 mV and 1150 mV, respectively. Neutral region 26 is added in order to increase the reference voltage to 1 V or more. The low content of Al, 13%, in region 26 causes a band discontinuity of 140 mV, which in association with the n−n+ intrinsic junction, depletes neutral region 26 completely. This leads to a voltage drop proportional to the length $d_n$ of neutral region 26. For example, the peak voltage of resonant tunneling diode 10 with the neutral region 26 length $d_n$ of 220 Å and a quantum well 18 thickness $d_q$ of 30 Å, is 1150 mV as shown in FIG. 4. The current density versus applied voltage graph of FIG. 4 describes the resonant tunneling diode 10 having a quantum well width $d_q$ of 30 Å and a device width $d_d$ of 290 Å, as compared to 280 mV for diode 10 without neutral region 26 as shown in FIG. 3. The current density verses applied voltage graph of FIG. 3 is of resonant tunneling diode 10 having a quantum well width $d_q$ of 30 Å and a device width $d_d$ of 70 Å. The additional voltage drop due to neutral region 26 is insensitive to temperature and radiation because the voltage drop depends only on device geometry. In this way an arbitrary reference voltage can be obtained without introducing temperature sensitive circuitry.

Changing layer 26 (neutral region) from $Al_{0.13}Ga_{0.87}As$ to GaAs and layer 32 from n+ GaAs to $n+Al_xGa_{1-x}As$ where x=0.47, the change of the energy-level diagram of the equilibrium state is shown by dotted line 36 in FIG. 2. The latter approach is another way of introducing the neutral region.

Other heterostructures incorporating $In_{0.52}Ga_{0.48}As$ as layers 22 and 24 adjacent to quantum well 18, may be used to increase the conduction band discontinuity and improve the tunneling diode characteristics at high temperatures. Also to achieve the same properties, the strained lattice incorporating $In_{0.15}Ga_{0.85}As$ and $Al_{0.15}Ga_{0.85}As$ as layers 22 and 24, respectively, adjacent to well 18, may be used.

Figure 5A:
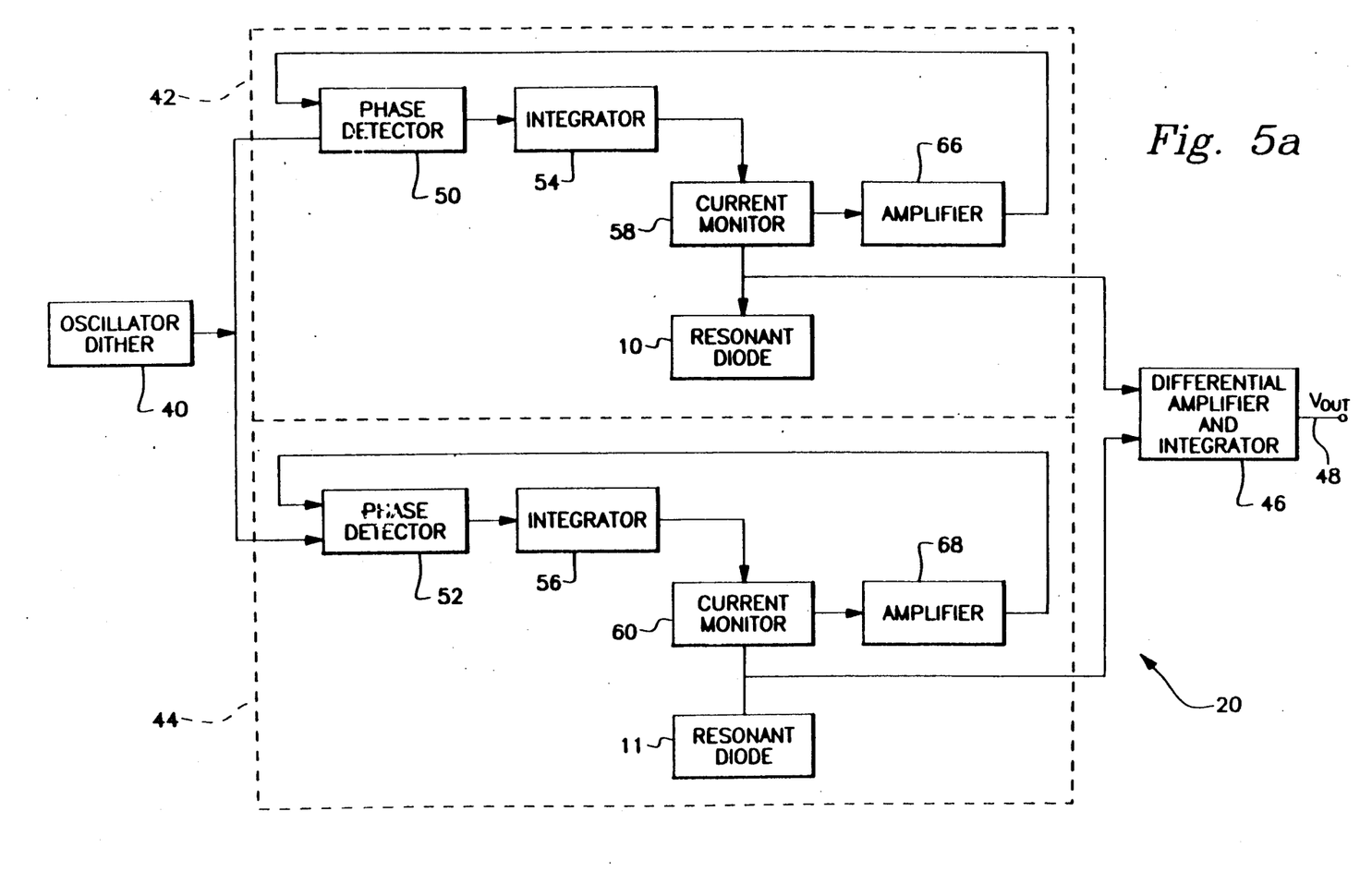
FIG. 5a is a block diagram of the support electronics having two feedback loops for the precision voltage reference.

The current density (J=amperes/square centimeters) versus applied voltage (V) curves of FIGS. 4 and 5 are outputs of a modeling program based on a study of resonant tunneling in $Ga_{1-x}Al_x/GaAs$ heterostructures described by the Schroedinger equation and solved by the scattering matrix formalism. Assumptions for a model included: that each barrier or well contains a large enough number of atomic sublayers so that the effective mass approximation is valid; carriers are described by quadratic energy-momentum relations; the difference in the effective mass from layer to layer is incorporated in the model; under bias, the GaAlAs and GaAs layers are modeled by varying potential barriers and wells throughout the thickness of the layers; charge transport takes place predominantly by electrons since 85 percent of the band-gap difference appears in the conduction band; rounding at the band edges due to depletion effects is included; transverse electron energies are included; the area of the multilayer stack is large enough so that the boundary effects are negligible; the carrier mean free path is long enough for carriers to traverse several periods without losing coherence due to scattering; no sources or sinks exist in the intermediate layers; and currents resulting from transfer between states obey Fermi-Dirac statistics. Inputs into the modeling program were: temperature, geometry of the superlattice structure and spacial step size, barrier and Fermi-energy, electron energy limits, relative and absolute error of integration, applied voltage range, and voltage step size.

In FIG. 3, although the amplitude of the peak current varies noticeably with temperature, there is only a slight temperature variation in the J-V characteristics with respect to voltage. The rapid drop-off of the J-V characteristic determines the position of the peak voltage. The current peaks are well defined and adjacent to the rapid drop-off. Incidently, typical measured resonant peaks are sharper than the simulated peaks of FIG. 3. The slight voltage variation at the peak is due to the spread in the Fermi-Dirac probability function at high temperatures. Therefore, the resonant tunneling occurs at a slightly lower applied voltage for high temperatures. Consequently, the device temperature sensitivity at room temperature may be approximated as:

$$\frac{dV}{dT} \approx \frac{-kt}{300K} \approx \frac{-26 \text{ mV}}{300K} \approx \frac{-0.09 \text{ mV}}{K} = \frac{-0.09 \text{ mV}}{°C}$$

The temperature sensitivity for the GaAs superlattice structure is small in comparison to the silicon bipolar junction where dV/dT is in the range of 1 to 2 mV/°C., i.e., the GaAs structure is at least one order of magnitude less sensitive to temperature change than a like silicon device. The dV/dT for the GaAs structure is relatively constant for different resonant diode voltages. Thus, a constant reference voltage generator can be based on the voltage difference between two resonant tunnel diodes, which mostly depends on the neutral region length.

Figure 5B:
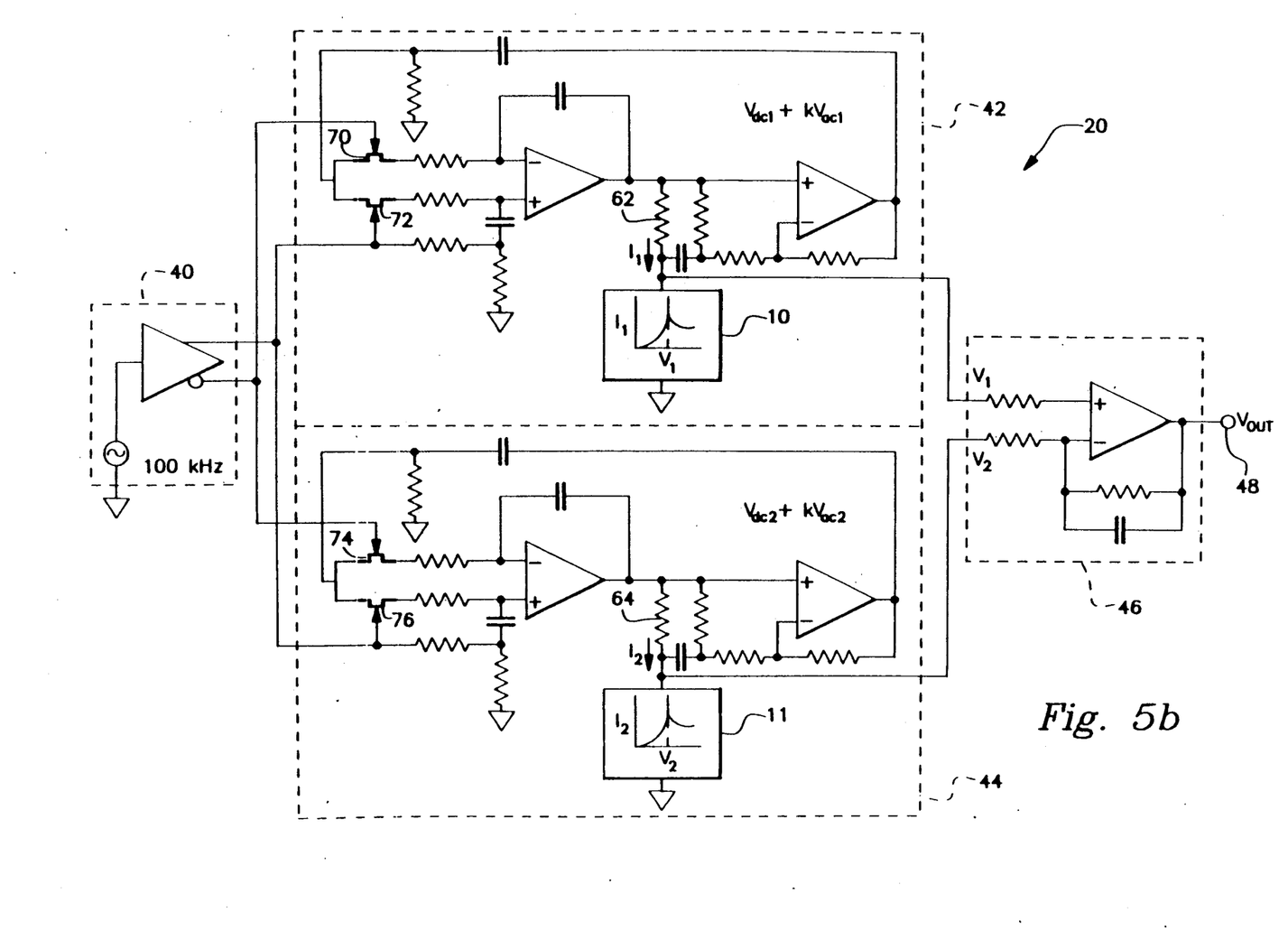

In FIGS. 5a and 5b, circuit 20 is set forth as a block diagram and schematic, respectively. Circuit 20 is the support electronics for the precision voltage reference. Support electronics 20 has two sub-circuits 42 and 44. Of sub-circuits 42 and 44, each tracks the resonant peak of the J-V curve of the respective diode of diodes 10 and 11. Each sub-circuit "locks-in" on the peak and avoids the negative resistance (the portion of the curve to the right of the current peak) and compensates for current variations at the resonant voltage. Each of sub-circuits 42 and 44 has a phase-sensitive feedback loop having high gain. The result is a precision voltage at output 48 of amplifier 46, that depends only on the J-V characteristics of the radiation-hardened superlattice tunneling diodes 10 and 11, and output 48 is independent of temperature characteristics of sub-circuits 42 and 44. Phase-sensitive system 20 allows the precision voltage output 48 to be essentially independent of variations in the offset voltages of the operational amplifiers due to temperature and radiation.

Oscillator 40 provides a small amplitude high-frequency (i.e., 100 kilohertz) dither voltage to track, through determination of the direction of tracking on the J-V curves, the resonant peaks of diodes 10 and 11. The dither voltage is fed to phase detectors 50 and 52. In-phase and out-of-phase dither voltage frequency signals from oscillator 40 go to phase detectors 50 and 52 and on to integrators 54 and 56, respectively. The outputs of integrators 54 and 56 are direct current (DC) voltages integrated over a long period (i.e., 1 millisecond to 1 second) having a superimposed in-phase dither frequency of at least 100 kilohertz. These signals are fed through current monitors 58 and 60 on to resonant tunneling diodes 10 and 11. Current monitors 58 and 60 may be resistors 62 and 64, respectively, which are typically less than 10 ohms each. A voltage source rather than a current source was selected as the forcing function for resonant diodes 10 and 11 to remove the possibility of circuit oscillations due to negative differential resistance of resonant tunneling diodes 10 and 11.

Amplifiers 66 and 68 amplify the voltages $V_1$ and $V_2$ across resistors 62 and 64 corresponding to currents $I_1$ and $I_2$, respectively, which go into diodes 10 and 11. The output voltages $V_1$ and $V_2$ of 66 and 68 are then fed back to switching field effect transistors (FET's) 70, 72, 74 and 76 of phase detectors 50 and 52, respectively. If currents $I_1$ and $I_2$ are in phase with the respective voltages $V_1$ and $V_2$, then FET switches 72 and 76 are turned on and the outputs of integrators 54 and 56 increase. However, if circuit 20 is operating on the negative differential resistance portion of the J-V characteristics of diodes 10 and 11; then currents $I_1$ and $I_2$ are out of phase with the respective voltages $V_1$ and $V_2$, and FET switched 70 and 74 are turned on thereby decreasing the output voltages of integrators 54 and 56.

The differential outputs of diodes 10 and 11 are input to differential amplifier and integrator 46. The alternating current (AC) voltage component at output 48 can be reduced to less than one part in a million by satisfying the following expression.

$$\frac{V_{AC}}{V_{DC}} = \frac{V_{dither}}{V_{output}} \times \frac{F_{filter}}{F_{dither}} < 10^{-6}$$

V represents volts and F represents frequency $F_{filter}=3$ db point of a single pole filter.

FIG. 5b is a detailed implementation of the block diagram of FIG. 5a. Preferred and radiation-hard components of circuit 20 may incorporate gallium arsenide MESFET's and operational amplifiers that may include MESFET and Schottky diode components.

Figure 6A:
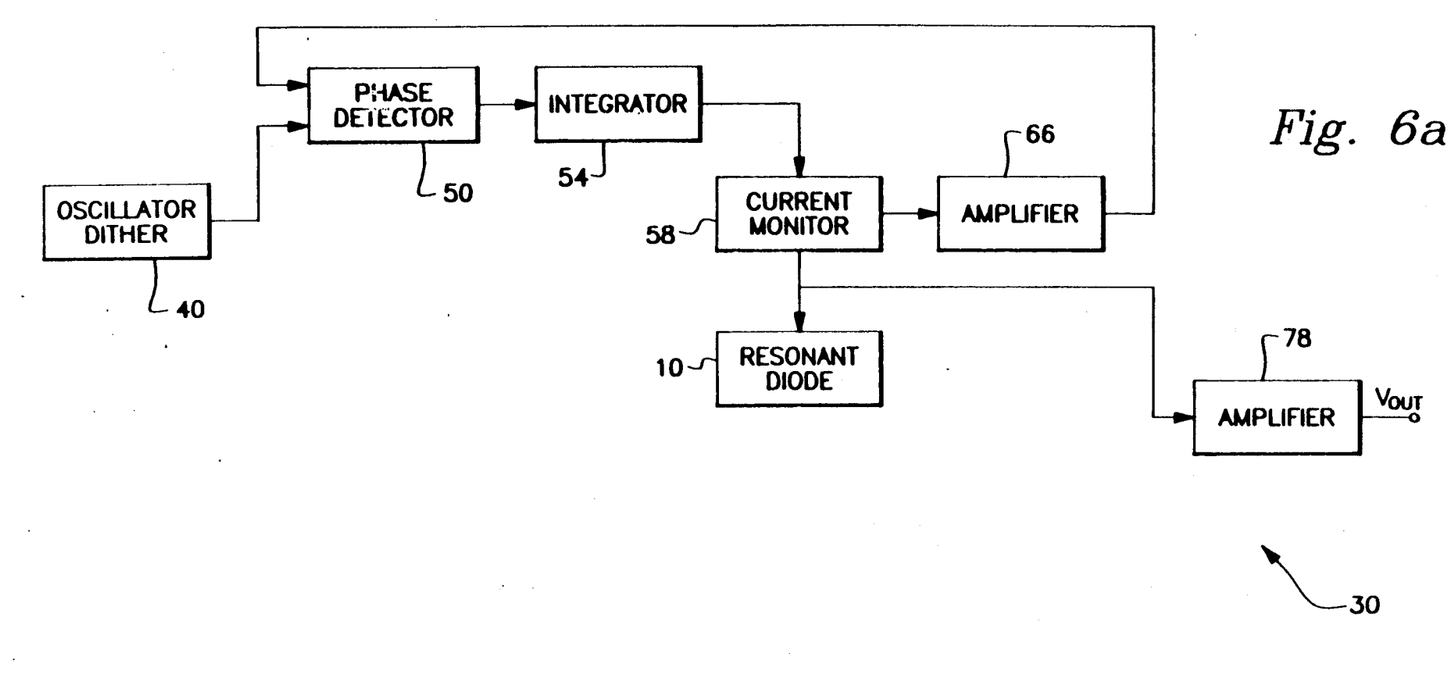
FIG. 6a is a block diagram of the support electronics having one feedback loop for the precision voltage reference.
Figure 6B:
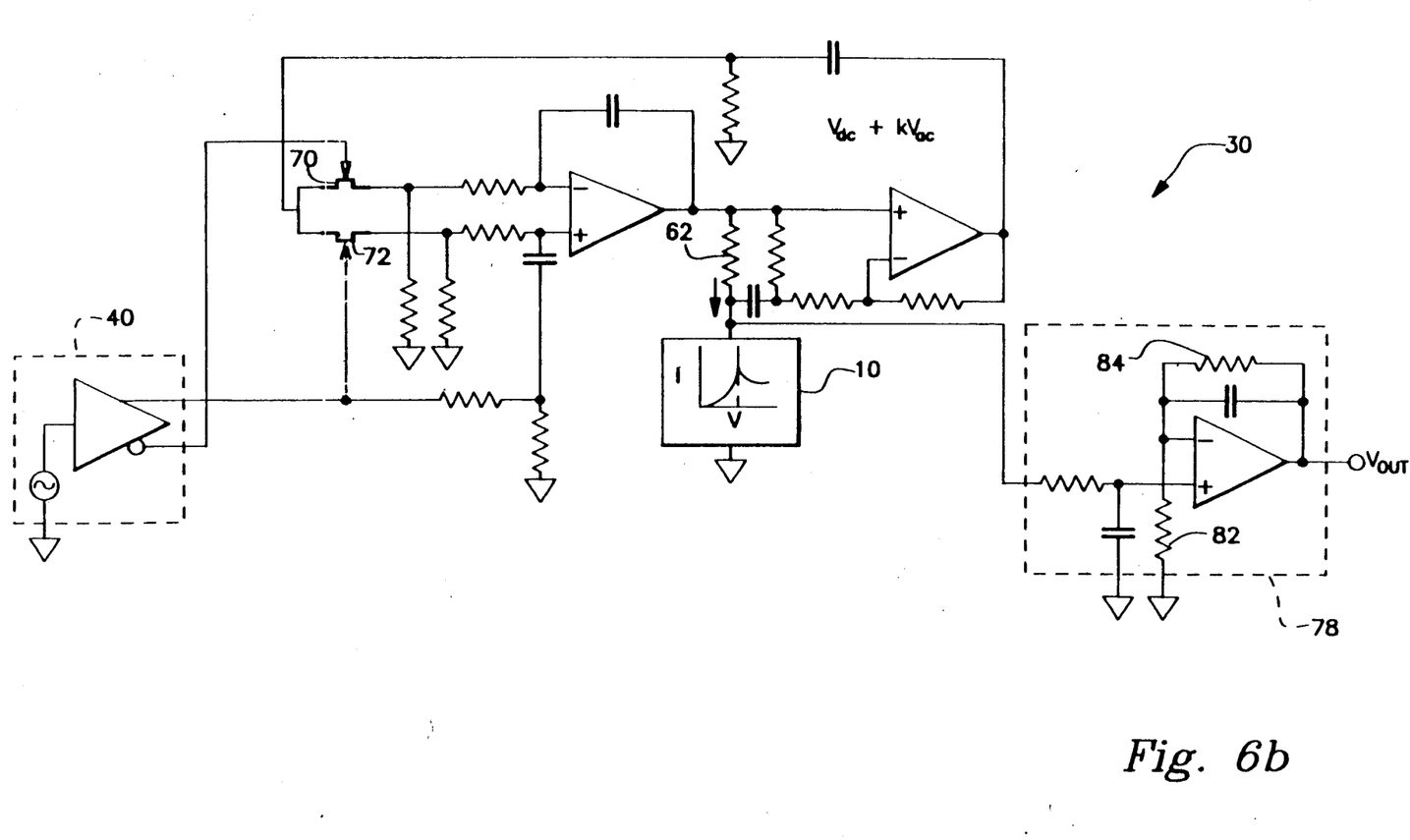

FIGS. 6a and 6b represent another embodiment 30 of support electronics for diode 10. FIG. 6 is a block diagram of electronics circuit 30 and is similar to sub-circuit 42. Circuit 30 has a single feedback loop whereas circuit 20 has two feedback loops. FIG. 6b is a detailed implementation of FIG. 6a using mostly like components as those of FIG. 5b. The resistors 82 and 84 of amplifier 78 can be constructed from materials having different temperature coefficients and laser trimmable designs to achieve the precision output voltage having a near zero voltage versus temperature slope. Although circuit 30 requires a process developed to obtain the resistors having the proper temperature coefficients, circuit 30 alleviates the need for the two feedback loops of circuit 20.

The present invention may be embodied in silicon or any other semiconductor technology.

We claim:

1. A superlattice precision voltage reference comprising:
   a first superlattice resonant tunneling diode having a peak current flow at a specific voltage.
   a second superlattice resonant tunneling diode having a peak current flow at a specific voltage; and
   support electronics means, connected to said first and second resonant tunneling diodes, for tracking the peak current flows of said first and second resonant tunneling diodes and for providing a precision voltage reference output.

2. Device of claim 1 wherein each of said first and second tunneling diodes comprises:
   a host semi-insulating substrate;
   a first layer of doped semiconductor material forming an ohmic contact, on said host semi-insulating substrate;
   a superlattice structure comprising a double barrier system having a layer of smaller band-gap material sandwiched between two layers of larger band-gap material, on said first layer of doped semiconductor material; and
   a second layer of doped semiconductor material forming an ohmic contact, on said superlattice structure.

3. Device of claim 2 wherein each of said first and second tunneling diodes comprises a superlattice neutral region layer placed between said first layer of doped semiconductor material and said superlattice structure.

4. Device of claim 3 wherein said support electronics means comprises:
   a first current monitor connected to said first resonant tunneling diode;
   a first amplifier connected to said first current monitor;
   a first phase detector connected to said first amplifier;
   a first integrator connected to said first phase detector and to said first current monitor:
   a second current monitor connected to said second resonant tunneling diode;
   a second amplifier connected to said second current monitor;
   a second phase detector connected to said second amplifier;
   a second integrator connected to said second phase detector and to said second current monitor;
   a frequency source connected to said first and second phase detectors; and
   an amplifier and integrator, connected to said first and second resonant tunneling diodes, for providing the precision voltage reference output.

* * * * *